United States Patent
Hilton

(10) Patent No.: US 6,600,438 B2
(45) Date of Patent: Jul. 29, 2003

(54) BROADBAND IF CONVERSION USING TWO ADCS

(75) Inventor: Howard E. Hilton, Snohomish, WA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/982,472

(22) Filed: Oct. 18, 2001

(65) Prior Publication Data

US 2003/0080890 A1 May 1, 2003

(51) Int. Cl.⁷ ............................. H03M 1/06; H03M 1/12
(52) U.S. Cl. .................................. 341/155; 341/118
(58) Field of Search ............................ 341/118, 120, 341/131, 139, 155, 157, 143; 375/329, 355; 342/151, 357, 101, 13; 348/475, 726

(56) References Cited

U.S. PATENT DOCUMENTS

| | | | | |
|---|---|---|---|---|
| 4,866,449 A | | 9/1989 | Gaffney | 342/151 |
| 5,563,596 A | * | 10/1996 | Snyder et al. | 341/131 |
| 5,724,396 A | * | 3/1998 | Claydon et al. | 375/355 |
| 5,787,125 A | * | 7/1998 | Mittel | 375/329 |
| 6,414,612 B1 | * | 7/2002 | Quesenberry | 341/120 |

* cited by examiner

*Primary Examiner*—Patrick Wamsley
(74) *Attorney, Agent, or Firm*—Robert T. Martin

(57) ABSTRACT

Correction of differences between two analog to digital converters (ADCs) in broadband intermediate frequency conversion. By stimulating a two-ADC system with a known input, the impulse response of the system is derived, and from that impulse response a finite impulse response filter is derived which corrects for mismatches between the ADCs.

27 Claims, 3 Drawing Sheets

BROADBAND IF CONVERSION USING TWO ADCS

FIELD OF THE INVENTION

The present invention pertains to broadband intermediate frequency (IF) conversion using two analog to digital converters (ADCs), and to approaches for correcting differences between the two ADCs.

ART BACKGROUND

In broadband receivers, the conversion of broadband intermediate frequency (IF) signals to digital samples has been approached in several ways. A simple approach is to use a single high-speed analog to digital converter (ADC) to convert the analog IF signal to digital samples directly. For this approach to work, the ADC sample rate Fs must be greater than twice the bandwidth of the IF signal. The inherent trade-off between ADC sample rate and accuracy has limited the ability of this approach to achieve sufficient accuracy for broadband IFs.

Another common approach is to convert the IF signal to baseband In-phase and Quadrature (I/Q) signals by using a pair of mixers in a co-quad configuration. The I and Q signals are then digitized by a pair of ADCs. The sample rate of these ADCs must be greater than the original bandwidth of the original IF signal. This sample rate is half the sample rate required for the single ADC approach. However, analog inaccuracies in the conversion from IF to I/Q signals introduces inaccuracies that limit this approach's ability to achieve sufficient accuracy for broadband signals.

A third approach is to sample the IF directly using multiple high accuracy ADCs in a round-robin fashion to achieve a sufficiently high composite sampling rate. This approach has not been used for communications IF signals because of the requirement to achieve very precise matching and timing offsets of the multiple ADC samples. The multiple ADC approach has been used for other lower accuracy applications such as high bandwidth oscilloscopes.

What is needed is a way to calibrate and correct for mismatch between two ADCs in a two-ADC I/Q system.

SUMMARY OF THE INVENTION

By stimulating a two-ADC IF to I/Q conversion system with a known input, a mechanism for calibrating and correcting mismatch between the ADCs is provided. Mismatches in amplitude and time can be efficiently corrected in real-time ADC sampling at high sample rates by passing ADC samples through a derived finite impulse response (FIR) filter.

BRIEF DESCRIPTION OF THE DRAWINGS

The present invention is described with respect to particular exemplary embodiments thereof and reference is made to the drawings in which.

DETAILED DESCRIPTION

Difficulty in producing high-speed, high-accuracy analog to digital converters (ADCs) for use in systems such as high bandwidth intermediate frequency (IF) signal processing makes the use of round-robin techniques using multiple ADCs desirable. One traditional way of using two ADCs is to use an analog co-quad mixer to effectively multiply the incoming real signal by a complex sinusoid at the IF frequency to produce baseband I/Q signals. These signals can be sampled and converted to a digitized I/Q sample sequence. Normally the analog I/Q signals are each filtered by a lowpass filter to assure that the bandwidth does not exceed one-half the ADC sample rate.

Figure 1:
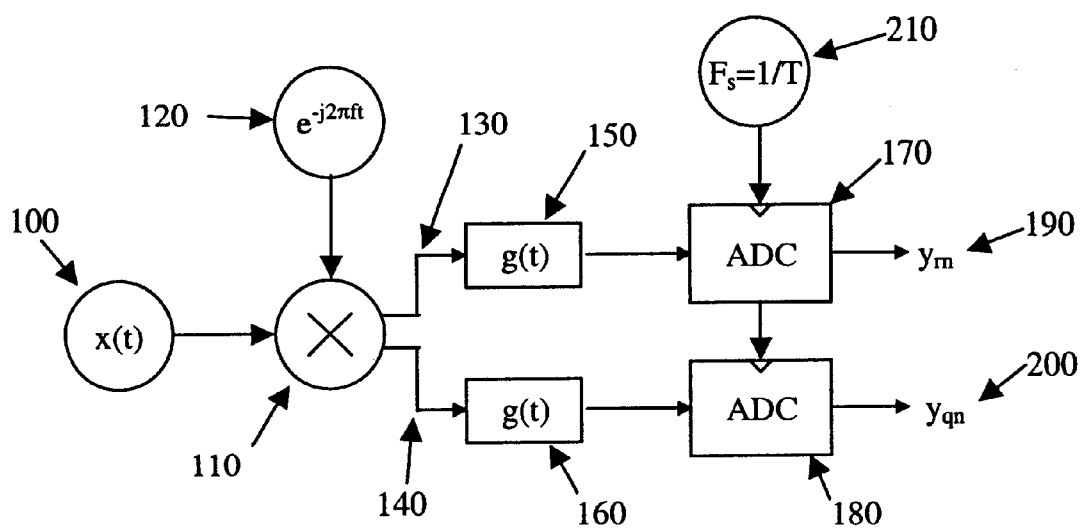
FIG. 1 shows analog down-conversion to I/Q signals as known to the art.

FIG. 1 shows the block diagram of a typical co-quad system. Incoming real signal 100 is fed to co-quad mixer 110 and is multiplied by a complex sinusoid 120 at the IF frequency to produce baseband I 130 and Q 140 signals. These baseband I/Q signals 130, 140 are low pass filtered 150, 160 to assure that the signal bandwidth does not exceed one half of the ADC sample rate Fs. These analog baseband signals are digitized by ADCs 170 and 180 producing the digital I 190 and Q 200 sequences. Driving both ADCs from the same clock 210 helps to minimize timing errors.

A mathematical expression for the I/Q sample sequence out of the traditional I/Q down-converter is given in equation (1). This equation assumes ideal operation of the analog processing blocks. In reality, there are several difficulties with this approach: mismatches in the I and Q filters, DC offsets, 1/f noise, gain mismatch, and quadrature errors in the co-quad mixer. The DC offsets and 1/f noise are of concern primarily because the signal of interest has been intentionally converted to the spectrum around DC. These problems severely limit the useful dynamic range of such a receiver.

$$y_n = y_{1n} + jy_{2n} = \left[ x(t) e^{\frac{-j\pi t}{T}} \otimes g(t) \right]_{t=nT} \quad (1)$$

Figure 2:
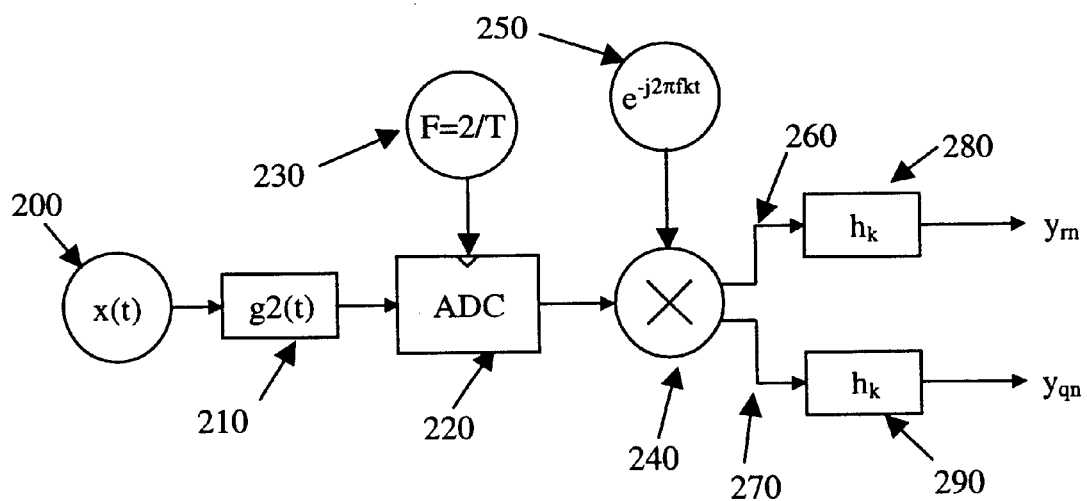
FIG. 2 shows direct IF sampling as known to the art.

An alternate implementation known to the art is shown in FIG. 2. In this case the co-quad mixer and low-pass filters are implemented digitally on the sampled data sequence. Input signal 200 is filtered 210, with a bandwidth of Fs to assure the Nyquist criteria is met. ADC 220 digitizes the low-pass filtered samples, producing digital samples fed to mixer 240, which mixes the samples with clock 250. The resulting digital streams representing I 260 and Q 260 signals are then low-pass filtered 280, 290. Note that digital filters 280 and 290 are independent—data is processed separately in each channel. This implementation accomplishes the same goal as the analog implementation with some significant advantages. It avoids the dynamic range limitations imposed by DC offset and 1/f noise. Since the mixing and filtering operations are performed digitally, they can be performed with as much precision as needed. Thus, I/Q mismatch errors and quadrature errors are completely eliminated. If the IF frequency is restricted to f=Fs/2=½T, the local oscillator and co-quad mixer implementation become trivial.

The direct IF sampling approach of FIG. 2 has its limitations. The ADC and most of the DSP must run at 2Fs to achieve a final I/Q sample rate of Fs. The IF center frequency is restricted to the range 0<f<Fs. For wideband signals this means the IF center frequency must be nominally Fs/2 or one-fourth the ADC sample rate. Since the ADC sampler must handle signal frequencies twice as high as the previous block diagram, it is more difficult to achieve good linearity in this design.

Figure 3:
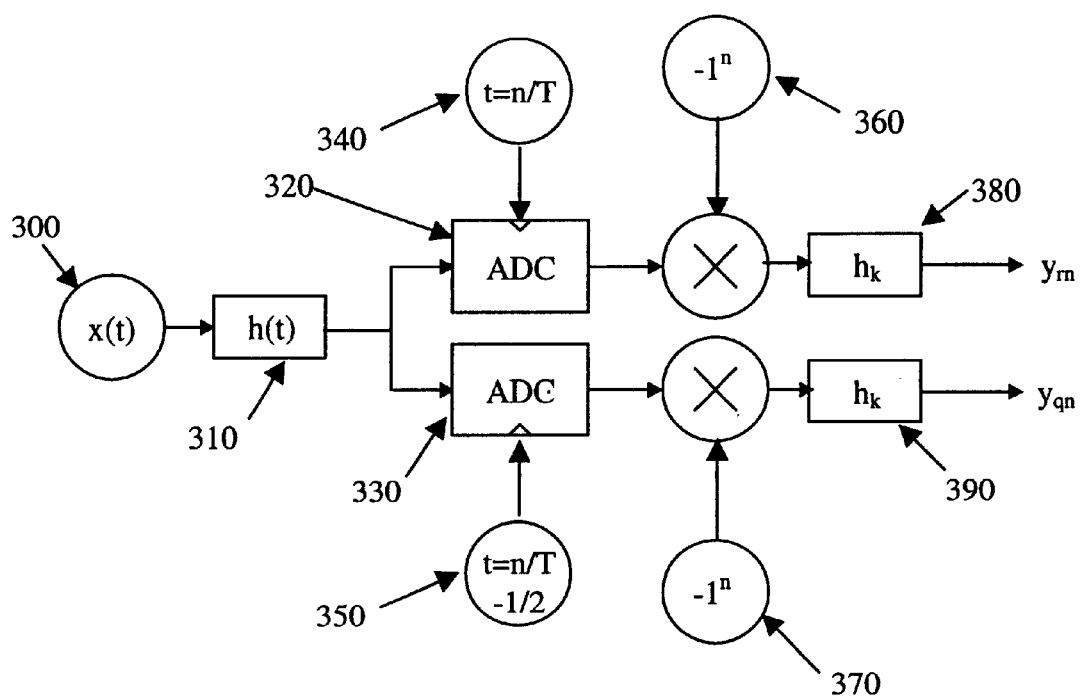
FIG. 3 shows dual ADC direct IF sampling as known to the art.

FIG. 3 shows a design using two ADCs to reduce the sample rate at the individual ADC. Input signal 300 is Nyquist filtered 310 and fed to ADCs 320 and 330. In this design, ADCs 320 and 330 are driven by clocks 340, 350 which must be offset by exactly T/2. By constraining the IF to be exactly at Fs/2, sequence for local oscillators 360 and 370 becomes $\{1, -j, -1, j, \ldots\}$. This sorts the sampled data stream so that even samples get processed through the real channel, and odd samples get processed through the quadrature channel. At the 2Fs sample rate, each of these channels has zeros interleaved with the data. Since the output of the lowpass filters 380 and 390 are going to be decimated to a sample rate of Fs, half of the filter taps are never actually used. Thus, it isn't really necessary to feed the filters with alternating zeros. All the DSP computations can operate at the ultimate output sample rate of Fs. The only distinction is that the real channel uses the even taps from the original lowpass impulse response, while the quadrature channel uses the odd taps.

The design shown in FIG. 3 preserves the immunity to DC offset and 1/f noise. It also simplifies the DSP by removing the need for an arbitrary local oscillator. The multipliers become simple sign inverters. All the DSP can now run at the final output frequency of Fs=1/T.

The introduction of a second ADC reintroduces the potential for ADC mismatch. If the time offset between the two ADCs is not exactly T/2, this approach will introduce a quadrature error.

In the present invention these repeatable errors are removed by adjusting the lowpass filter coefficients and introducing cross terms in a combined filter. The two separate low-pass filters of FIG. 3 become a combined filter which must implement a matrix impulse response as shown in FIG. 4.

Figure 4:
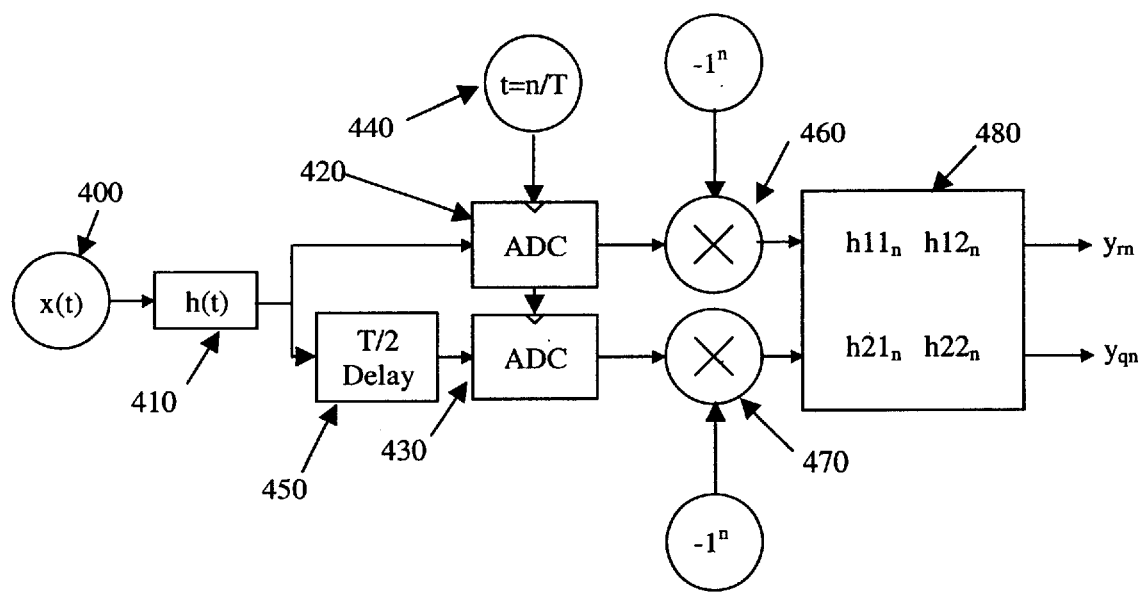
FIG. 4 shows a first embodiment of dual ADC direct sampling with compensation.

As shown in FIG. 4, input signal 400 is fed to low pass filter h(t) 410 wide enough to pass the entire IF signal. ADCs 420 and 430 are clocked by the same clock 440 (with period T) and sample the same input signal, except that the lower signal input to ADC 430 is delayed 450 by T/2. All the subsequent processing is done digitally at the ADC clock period. First, both ADC outputs are multiplied 460, 470 by alternating +1 and −1. The resulting 2-channel signal is convolved 480 with a finite sequence of 2×2 matrices. The resulting outputs are the corrected I/Q baseband sample sequence.

Figure 5:
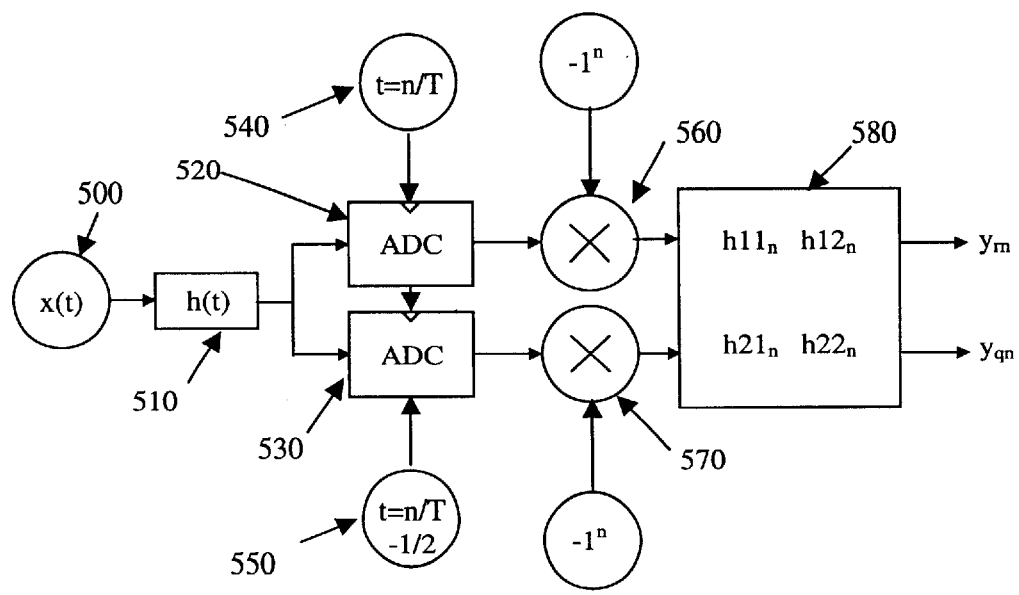
FIG. 5 shows a second embodiment of dual ADC direct sampling with compensation.

FIG. 5 shows an alternative embodiment of the present invention. In this embodiment, input signal 500 is fed to low pass filter h(t) 510 wide enough to pass the entire IF signal. ADCs 520 and 530 are clocked by delayed clocks. Where ADC 520 is clocked at a rate t=nT, the clock for ADC 530 is delayed by T/2, or t=nT−T/2. The remaining processing of digital samples is the same as in the embodiment of FIG. 4, multiplying 560, 570 ADC outputs by alternating +1 and −1, then convolving 580 the resulting 2-channel signal with a finite sequence of 2×2 matrices, producing the corrected I/Q baseband sample sequence.

The process of calculating the sequence of 2×2 matrices is divided into two major steps. The first step is to measure the impulse response of the system. This is done by stimulating the system with a square wave of period (N+½)T where N is the desired length of the FIR compensation filter and T is the ADC sample period. The second major step is to calculate the compensation filter taps, the necessary 2×2 matrix sequence required to compensate the analog errors, given the measured impulse response of the system.

Measuring the System Impulse Response

1. Stimulate the input with a square wave of period (N+½)T, where N is the length of the FIR compensation filter, and T is the ADC sample period. In the preferred embodiment, the square wave is provided by a pECL square wave generator. The resulting signal has a very short rise time.

2. To obtain a good signal to noise ratio estimate of signal response, a number of square-wave responses must be averaged together. Using R as the number of records to average, collect a contiguous record of samples spanning greater than 2R+1 periods of the square wave. Data is collected for both the I-channel and the Q-channel.

3. Search the I-channel data for the first rising edge of the square wave. Mark the last sample prior to the beginning of this first rising edge as sample index 0.

4. Time average the R sub-records of length (2N+1) samples each. Do step 4–11 on the I-channel and the Q-channel independently.

5. Reorder the samples according to the original indices $\{0, N+1, 1, N+2, 2, \ldots 2N, N\}$. The result should be a square wave sampled at intervals of T/2.

6. Replace each sample by the difference between it and the next sample $x'_n = x_{n+1} - x_n$. Note that the indices referred to here are the new indices after reordering. Also, only the first 2N samples can be replaced since there is no sample following the last one. The result after this operation should be an approximate impulse response with T/2 time resolution.

7. Zero out all samples which are clearly outside the duration of the impulse response. This reduces unnecessary noise in the subsequent computations.

8. Perform an in-place 2N point real Fourier Transform. This gives N+1 complex values representing the positive frequency response to Fs/2. Note: since the first and last values are real, the last value is usually packed in place of the imaginary part of the first value. This allows the result to be returned in place without allocating additional space.

9. Multiply each complex value by x/sin(x), where $x = m\pi/2N$, m is the index of the complex frequency sample. This compensates for the finite difference approximation of the derivative taken in step 5.

10. Optionally, multiply by a frequency response correction vector to account for the fact that the calibration square wave does not have perfect zero rise-time edges. This correction record can be obtained by performing the calibration without step 10, then measuring the resulting frequency response with a calibrated sine source. The deviation from ideal can then be recorded and used in step 10 for subsequent applications of the calibration algorithm.

11. Perform an inverse real Fourier transform to obtain the corrected impulse response for the channel. This is a 2N point real vector.

At the conclusion of performing steps 4 through 11 for each of the I and Q channels, 2N point real vectors representing the I and Q channel impulse responses have been calculated. These vectors are used in calculating the taps for the compensation filter.

Calculation of Compensation Filter Taps

Forming the N 2×2 matrices for the FIR compensation filter will be described both in terms of the underlying mathematics, and in the steps which must be performed.

The desired IF signal processing of a real input signal, x(t), is given in the following equation.

$$y_n = y_{1n} + jy_{2n} = \left[\left(x(t) \cdot e^{\frac{-j\pi t}{T}}\right) \otimes g(t)\right]_{t=nT}$$

Where T is the sampling period, and g(t) is the impulse response of the desired IF filter, with bandwidth less than ½T.

The actual input signal from a dual ADC front-end is:

$$x_{1n} = [x(t) \otimes h_1(t)]_{t=nT}$$

$$x_{2n} = [x(t) \otimes h_2(t)]_{t=nT}$$

Where h1(t) is the impulse response of the I channel from the IF input connector through the I-channel ADC, and h2(t) is the impulse response of the Q channel from the IF input connector through the Q-channel ADC. The bandwidth of these responses is assumed to be less than 1/T.

$$x_n = (-1)^n \begin{bmatrix} x_{1n} \\ x_{2n} \end{bmatrix}$$

The vector $x_n$ is the sampled outputs of the I and Q ADCs multiplied by a unit magnitude sequence with alternating sign. The output of this sequence is then filtered by a FIR digital filter where each filter tap is a 2×2 matrix.

$$y_n = q_n \otimes x_n$$

The process then is to determine the appropriate calibration filter response $q_n$ so that $$\begin{bmatrix} y_{1n} \\ y_{2n} \end{bmatrix} = q_n \otimes x_n$$

for any input, x(t). This can be accomplished by explicitly writing out the convolution integrals.

$$\int_{\tau=-\infty}^{\infty} x(\tau) \cdot \begin{bmatrix} \operatorname{Re}\left(e^{\frac{-j\pi\tau}{T}} g(nT - \tau)\right) \\ \operatorname{Im}\left(e^{\frac{-j\pi\tau}{T}} g(nT - \tau)\right) \end{bmatrix} d\tau =$$

$$\int_{\tau=-\infty}^{\infty} x(\tau) \cdot \sum_{m=-\infty}^{\infty} q_m (-1)^{n-m} \begin{bmatrix} h_1(nT - mT - \tau) \\ h_2(nT - mT - \tau) \end{bmatrix} d\tau$$

Since the equality must hold true for any input signal x(t), the following equality must hold for all values of n and t.

$$\begin{bmatrix} \operatorname{Re}\left(e^{\frac{j\pi(nT-t)}{T}} g(nT - t)\right) \\ \operatorname{Im}\left(e^{\frac{j\pi(nT-t)}{T}} g(nT - t)\right) \end{bmatrix} = \sum_{m=-\infty}^{\infty} q_m (-1)^m \begin{bmatrix} h_1(nT - t - mT) \\ h_2(nT - t - mT) \end{bmatrix}$$

Because of the bandwidth limits on the filters the impulse responses g, $h_1$, and $h_2$ are all fully specified with time samples spaced at intervals of T/2. Thus, the constraint above need only be evaluated at discrete time points t=0 and t=T/2. The constraint at both of these time points can be written into a single matrix equation.

$$\begin{bmatrix} g(nT) & 0 \\ 0 & g(nT + T/2) \end{bmatrix} =$$

$$\sum_{m=-\infty}^{\infty} q_m (-1)^{n-m} \begin{bmatrix} h_1((n-m)T) & h_1((n-m)T + T/2) \\ h_2((n-m)T) & h_2((n-m)T + T/2) \end{bmatrix}$$

It is now useful to define the following matrices.

$$h_m = (-1)^m \begin{bmatrix} h_1(mT) & h_1(mT + T/2) \\ h_2(mT) & h_2(mT + T/2) \end{bmatrix}$$

$$g_n = \begin{bmatrix} g(nT) & 0 \\ 0 & g(nT + T/2) \end{bmatrix}$$

The desired set of coefficient matrices, $q_m$, is found by solving a matrix convolution equation.

$$g_n = \sum_{m=-\infty}^{\infty} q_m \cdot h_{n-m}$$

This solution can be approached by transforming to the frequency domain. The length of the transform, N, must be long enough to encompass the complete impulse responses g, $h_1$, and $h_2$.

$$\sum_{n=0}^{N-1} e^{\frac{-j2\pi kn}{N}} g_n = \sum_{m=-\infty}^{\infty} q_m e^{\frac{-j2\pi km}{N}} \sum_{n=0}^{N-1} e^{\frac{-j2\pi k(n-m)}{N}} h_{n-m}$$

Substitute p=n−m. This changes the limits on the third summation.

$$\sum_{n=0}^{N-1} e^{\frac{-j2\pi kn}{N}} g_n = \sum_{m=-\infty}^{\infty} q_m e^{\frac{-j2\pi km}{N}} \sum_{p=-m}^{N-1-m} e^{\frac{-j2\pi kp}{N}} h_p$$

The limits on the third summation may be adjusted to be independent of m if the value being summed is periodic in N. This is accomplished by replacing h with h' which is a cyclic version of the finite duration impulse response.

$$h'_p = h_{p \bmod N}$$

Making this substitution and limiting the number of filter taps gives the following. Note that the filter taps are non-zero only the range 0 through N−1. Thus, N must be chosen large enough to encompass the complete compensation filter impulse response. In general this will be somewhat longer than the g and h responses. Making N too small will limit the degrees of freedom needed to produce a good calibration response.

$$\sum_{n=0}^{N-1} e^{\frac{-j2\pi kn}{N}} g_n = \sum_{m=0}^{N-1} e^{\frac{-j2\pi km}{N}} q_m \sum_{p=0}^{N-1} e^{\frac{-j2\pi kp}{N}} h'_p$$

Each of the summations in the preceding equation represents a Fourier transform. Using capitals letters to denote the transforms yields the following constraint equation.

$$G_k = Q_k H_k$$

This is solved for the frequency response of the desired calibration filter. Note that the transformed matrix elements are complex, so the indicated multiplication require complex operations. Also, note that since the original time domain matrices were real, the transformed matrices have conjugate symmetry with respect to the k index modulo N. This fact can be utilized to reduce the variable storage and computation time.

$$Q_k = G_k H_k^{-1}$$

To get the impulse response now requires taking the inverse Fourier transform.

$$q_m = \sum_{k=0}^{N-1} e^{\frac{-j2\pi km}{N}} Q_k$$

Calibration Steps

1. Separate the I-channel impulse response into two N-point responses, $h11_n$ from the even samples, and $h12_n$ from the odd samples. Separate the Q-channel impulse response into two N-point responses, $h21_n$ from the even samples, and $h22_n$ from the odd samples.

2. Invert the sign of the odd index entries of all four response vectors from step 1. The resulting four vectors form the samples of the h matrix given in the derivation of the previous section.

3. Perform a forward N-point real Fourier transform on each of the component vectors of h. The result is an N/2+1 length array of complex 2×2 matrices denoted as H in the derivation of the previous section. See the data packing note in step 8 of the system impulse response measurement.

4. Compute in place the inverse of each 2×2 complex matrix in H.

5. Generate the magnitude of the desired frequency response with N/2+1 equally spaced frequencies from 0 to ½T. Store it in a complex record suitable for doing the inverse real Fourier transform in the next step. A suitable response is a raised cosine response with transition band from 0.8/2T to ½T. This record forms the $G_{11k}$ element of the G matrix described in the derivation of the previous section.

6. Generate a phase ramped version of $G_{11k}$ to get $G_{22k}$. The phase increment per bin is π/N.

7. Multiply the G from steps 5 and 6 by $H^{-1}$ from step 4.

8. Apply the inverse real Fourier transform to each of the four complex records from step 9. This results in the N length array of real 2×2 matrices denoted as $q_m$ in the derivation of the previous section.

9. Calculate a norm of each element of $q_m$ by summing the squares of each of the four matrix components. Store the result in a single record $p_m$. While doing this, record in MAG2 the largest occurrence of $(h_{11}*h_{11}+h_{12}*h_{12})$ and $(h_{21}*h_{21}+h_{22}*h_{22})$.

10. Considering $p_m$ as a cyclic function (indices modulo N) find a segment of M contiguous elements with the largest sum. For the following step treat the zero index as the beginning of this M-point segment.

11. Using the starting index found in step 10, the desired filter taps for the correction filter are the M contiguous values, modulo N, of $q_m$ sequences found in step 8.

This completes the calculation of the N 2×2 matrices needed for the filter.

The process of measuring the impulse response of the system and calculating the correction filter parameters may be performed at different times. It is desirable to perform the process as part of system testing, and to save an initial filter configuration. In the preferred embodiment, this configuration is stored in non-volatile memory, and is loaded into signal processor memory on system startup. The measurement/calculation process may also be performed in response to other events. It may be performed in response to a user-generated request, on system power-up, periodically after a predetermined operating period, or in response to changing environmental conditions, such as changing temperature of temperature-sensitive portions of the system.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. In an IF conversion system accepting an analog input and producing digital I/Q outputs, the conversion system using a first and a second analog to digital converter, the process of:

Stimulating the system with a known analog input,

Recording the digital I/Q output produced by the analog input,

Calculating the impulse response of the system based on the recorded digital I/Q output, Calculating a finite impulse response filter from the calculated impulse response, Removing the known analog input from the system, and Applying the finite impulse response filter to system inputs.

2. The system of claim 1 where the known input stimulus is a square wave.

3. The system of claim 1 where the known input stimulus has a short rise time.

4. The system of claim 1 where the finite impulse response filter comprises a finite number of 2×2 matrices.

5. In an IF conversion system accepting an analog input and producing digital I/Q outputs, the conversion system using a first and a second analog to digital converter, the process of correcting for mismatches between the first and second analog to digital converters by passing the digital outputs of the first and second analog to digital converters through a finite impulse response filter comprising a finite number of 2×2 matrices.

6. The process of claim 5 where the finite impulse response filter is formed by:

Stimulating the system with a known input,

Recording the digital I/Q output produced by the known input,

Calculating the impulse response of the system based on the recorded digital I/Q output, and Calculating the finite impulse response filter from the calculated impulse response.

7. The process of claim 6 where the known input stimulus is a square wave.

8. The process of claim 5 where the steps of:

Stimulating the system with a known input,

Recording the digital I/Q output produced by the known input,

Calculating the impulse response of the system based on the recorded digital I/Q output, and Calculating the finite impulse response filter from the calculated impulse response are performed in response to internal system events.

9. The process of claim 8 where the internal system event is the passage of a predetermined period of time.

10. The process of claim 8 where the internal system event is a change in system environmental conditions.

11. The process of claim 8 where the internal system event is system power-up.

12. The process of claim 5 further comprising storing the matrices comprising the finite impulse response filter in a nonvolatile memory.

13. The process of claim 5 where the steps of:

Stimulating the system with a known input,

Recording the digital I/Q output produced by the known input,

Calculating the impulse response of the system based on the recorded digital I/Q output, and Calculating the finite impulse response filter from the calculated impulse response are performed in response to a request initiated by a user of the system.

14. An IF conversion system accepting an analog input and producing digital I/Q outputs, the system comprising:

a filter connected to the input producing a bandwidth limiting input signal, a sample clock having period T, a first analog to digital converter clocked by the sample clock for converting the bandwidth limited input signal to a first digital sequence, delay means for delaying the bandwidth limited input signal for a delay period of T/2 producing a delayed input signal, a second analog to digital converter clocked by the sample clock for converting the delayed input signal to a second digital sequence, a first digital multiplier for multiplying the first digital sequence by alternating +1 and −1, a second digital multiplier for multiplying the second digital sequence by alternating +1 and −1, and a finite impulse response filter comprising a finite sequence of 2×2 matrices for filtering the outputs of the first and second digital multipliers, producing digital I/Q outputs.

15. The system of claim 14 where the finite impulse response filter is formed by:

Stimulating the system with a known input,

Recording the digital I/Q output produced by the known input,

Calculating the impulse response of the system based on the recorded digital I/Q output, and Calculating the finite impulse response filter from the calculated impulse response.

16. The process of claim 15 where the process of forming the finite impulse response filter is performed in response to an internal system event.

17. The process of claim 16 where the internal system event is system power-up.

18. The process of claim 16 where the internal system event is the passage of a predetermined period of time.

19. The process of claim 16 where the internal system event is a change in system environmental conditions.

20. The process of claim 15 where the process of forming the finite impulse response filter is performed in response to a request initiated by a user of the system.

21. An IF conversion system accepting an analog input and producing digital I/Q outputs, the system comprising:

a filter connected to the input producing a bandwidth limiting input signal, a first sample clock having period T, a first analog to digital converter clocked by the first sample clock for converting the bandwidth limited input signal to a first digital sequence, a second sample clock having period T, the second sample clock delayed by a period T/2 from the first sample clock, a second analog to digital converter clocked by the second sample clock for converting the bandwidth limited input signal to a second digital sequence, a first digital multiplier for multiplying the first digital sequence by alternating +1 and −1, a second digital multiplier for multiplying the second digital sequence by alternating +1 and −1, and a finite impulse response filter comprising a finite sequence of 2×2 matrices for filtering the outputs of the first and second digital multipliers, producing digital I/Q outputs.

22. The system of claim 21 where the finite impulse response filter is formed by:

Stimulating the system with a known input,

Recording the digital I/Q output produced by the known input,

Calculating the impulse response of the system based on the recorded digital I/Q output, and Calculating the finite impulse response filter from the calculated impulse response.

23. The process of claim 22 where the process of forming the finite impulse response filter is performed in response to a request initiated by a user of the system.

24. The process of claim 22 where the process of forming the finite impulse response filter is performed in response to an internal system event.

25. The process of claim 22 where the internal system event is system power-up.

26. The process of claim 22 where the internal system event is the passage of a predetermined period of time.

27. The process of claim 22 where the internal system event is a change in system environmental conditions.

* * * * *